US007987007B2

(12) United States Patent
Lian et al.

(10) Patent No.: US 7,987,007 B2
(45) Date of Patent: Jul. 26, 2011

(54) MEMORY MODULE WITH AUDIO PLAYBACK MODE

(75) Inventors: Yam Fei Lian, Singapore (SG); Fook Chye Yee, Singapore (SG); Chon Hock Leow, Menlo Park, CA (US)

(73) Assignee: Creative Technology Ltd, Singapore (SG)

( * ) Notice: Subject to any disclaimer, the term of this patent is extended or adjusted under 35 U.S.C. 154(b) by 532 days.

(21) Appl. No.: 10/100,351

(22) Filed: Mar. 18, 2002

(65) Prior Publication Data

US 2003/0176935 A1 Sep. 18, 2003

(51) Int. Cl.
*G06F 17/00* (2006.01)

(52) U.S. Cl. ........................................... 700/94

(58) Field of Classification Search .................. 700/94; 379/357.81; 361/56, 684, 685, 737; 710/74, 710/72; 320/113, 115; D13/119, 433, 434; 720/632, 641; 84/601; 704/272; 360/2; 381/8

See application file for complete search history.

(56) References Cited

U.S. PATENT DOCUMENTS

| D217,157 S | 4/1970 | Trombly ........................ D26/14 |
| D308,197 S | 5/1990 | Inoue ............................ D14/114 |
| D316,853 S | 5/1991 | Dickey .......................... D14/107 |
| D317,913 S | 7/1991 | Inoue ............................ D14/114 |
| 5,301,334 A | 4/1994 | Horiuchi ....................... 395/750 |
| D348,874 S | 7/1994 | Pemberton .................... D14/114 |
| 5,497,464 A | 3/1996 | Yeh ........................... 395/200.01 |
| 5,640,349 A | 6/1997 | Kikamuma et al. |
| 5,663,901 A | 9/1997 | Wallace et al. |
| D406,573 S | 3/1999 | Yao .............................. D14/114 |
| D411,524 S | 6/1999 | Kitagawa et al. ............. D14/114 |
| 5,928,347 A | 7/1999 | Jones |
| D414,204 S | 9/1999 | Reichmann .................... D14/49 |
| 5,982,520 A | 11/1999 | Weiser et al. .................. 359/172 |
| 6,012,103 A | 1/2000 | Sartore et al. |
| 6,075,723 A | 6/2000 | Naiki et al. |
| 6,109,797 A * | 8/2000 | Nagura et al. .................. 385/88 |
| D431,231 S | 9/2000 | Goto ............................. D14/107 |
| 6,145,045 A | 11/2000 | Falik et al. |
| D438,525 S | 3/2001 | Katayama ...................... D14/156 |
| D443,859 S | 6/2001 | Hogan ............................ D13/133 |
| 6,252,791 B1 | 6/2001 | Wallace et al. |

(Continued)

FOREIGN PATENT DOCUMENTS

CN 2476848 Y * 2/2002

(Continued)

OTHER PUBLICATIONS

Universal Serial Bus Specification, Revision 1.1, Sep. 23, 1998. pp. 73-74.*

(Continued)

*Primary Examiner* — Andrew C Flanders

(57) ABSTRACT

A memory module with a playback mode for audio signals through a playback port, and having an input port for input of both analogue and data signals as well as power, the power being from a separate power source. The input port may be a USB or IEEE1394 port and may be used with a battery pack and cradle having a female socket for receiving therein the connector. The input port includes at least four terminals being: ground, power, and two differential data terminals; the differential data terminals carrying signals at frequencies in the range of from 1 to 480 MHz. The input port is also for passing power from the battery pack and cradle to the memory module.

26 Claims, 4 Drawing Sheets

U.S. PATENT DOCUMENTS

| | | | |
|---|---|---|---|
| 6,289,397 B1 | 9/2001 | Tsuyuguchi et al. | |
| D449,615 S | 10/2001 | Lloyd | D14/433 |
| D449,616 S | 10/2001 | Herath | D14/433 |
| D449,617 S | 10/2001 | Herath | D14/433 |
| D451,899 S | 12/2001 | Flagiello et al. | D14/160 |
| D451,900 S | 12/2001 | Flagiello et al. | D14/163 |
| D452,250 S | 12/2001 | Chan | D14/496 |
| 6,342,664 B2 * | 1/2002 | Sawada et al. | 84/601 |
| D454,130 S | 3/2002 | Do et al. | D14/433 |
| 6,353,870 B1 | 3/2002 | Mills et al. | 710/301 |
| 6,361,369 B1 | 3/2002 | Kondo et al. | |
| D461,476 S | 8/2002 | Evers et al. | D14/433 |
| 6,427,918 B1 | 8/2002 | Endejan et al. | 235/486 |
| D462,689 S | 9/2002 | Moran | D14/433 |
| D463,426 S | 9/2002 | Cheng | D14/356 |
| 6,490,163 B1 * | 12/2002 | Pua et al. | 361/737 |
| D468,312 S | 1/2003 | Huang et al. | D14/433 |
| D469,109 S | 1/2003 | Andre et al. | D14/496 |
| D470,499 S | 2/2003 | Salazar et al. | D14/436 |
| 6,546,495 B1 | 4/2003 | Shimura | |
| 6,606,281 B2 * | 8/2003 | Cowgill et al. | 369/11 |
| 6,631,098 B2 * | 10/2003 | Chang et al. | 369/7 |
| 6,833,848 B1 | 12/2004 | Wolff | |
| 7,103,381 B1 * | 9/2006 | Wright et al. | 455/557 |
| 7,106,541 B2 * | 9/2006 | Bruner et al. | 360/75 |
| 2001/0005641 A1 * | 6/2001 | Matsumoto et al. | 439/1 |
| 2001/0006884 A1 | 7/2001 | Matsumoto | 455/1 |
| 2001/0009846 A1 | 7/2001 | Loeuillet | 455/90 |
| 2001/0013983 A1 * | 8/2001 | Izawa et al. | 360/2 |
| 2001/0045985 A1 | 11/2001 | Edwards et al. | 348/231 |
| 2002/0010827 A1 | 1/2002 | Cheng | 711/103 |
| 2002/0023259 A1 | 2/2002 | Shimizu | |
| 2002/0029087 A1 | 3/2002 | Mayne et al. | 700/94 |
| 2002/0077834 A1 | 6/2002 | Estevez | 704/503 |
| 2002/0169912 A1 | 11/2002 | Mills et al. | 710/301 |
| 2002/0174287 A1 | 11/2002 | Cheng | 711/103 |
| 2002/0175665 A1 | 11/2002 | O'Grady et al. | 323/371 |
| 2002/0189429 A1 | 12/2002 | Qian et al. | 84/610 |
| 2003/0024060 A1 | 2/2003 | Weng | 15/210.1 |
| 2003/0063196 A1 | 4/2003 | Palatov et al. | 348/211.2 |
| 2004/0125522 A1 * | 7/2004 | Chiu et al. | 361/56 |
| 2004/0165302 A1 * | 8/2004 | Lu | 360/55 |

FOREIGN PATENT DOCUMENTS

| | | |
|---|---|---|
| DE | 4135220 | 4/1993 |
| DE | 20117530 | 1/2002 |
| EP | 0 929 043 A1 | 7/1999 |
| EP | 0982732 | 3/2000 |
| EP | 1 056 015 A1 | 11/2000 |
| EP | 1 113 355 A1 | 12/2000 |
| EP | 1059835 | 12/2000 |
| EP | 1 100 000 A2 | 5/2001 |
| EP | 1 126 378 A1 | 8/2001 |
| EP | 0 912 939 B1 | 9/2001 |
| EP | 1 146 428 A1 | 10/2001 |
| JP | 3081395 | 4/1991 |
| JP | 09259849 | * 10/1997 |
| JP | 1039954 | 2/1998 |
| JP | 1183816 | 3/1999 |
| JP | 20014387 | 1/2001 |
| JP | 2001101140 | 4/2001 |
| JP | 2001-142474 | 5/2001 |
| JP | 2001142474 | 5/2001 |
| JP | 2001-218160 | 8/2001 |
| JP | 2001218160 | 8/2001 |
| JP | 2001-243429 | 9/2001 |
| JP | 2001-265360 | 9/2001 |
| JP | 2001243429 | 9/2001 |
| JP | 2001265360 | 9/2001 |
| JP | 2002-023881 | 1/2002 |
| JP | 200223881 | 1/2002 |
| JP | 200233995 | 1/2002 |
| JP | 200249392 | 2/2002 |
| JP | 200250158 | 2/2002 |
| WO | PCT/EP92/02305 | 4/1993 |
| WO | WO 99/45460 | 9/1999 |
| WO | WO 00/39798 A1 | 7/2000 |
| WO | WO 00/60476 A1 | 10/2000 |
| WO | WO 00/75924 A1 | 12/2000 |
| WO | WO 01/23987 A1 | 4/2001 |
| WO | WO 01/61692 A1 | 8/2001 |
| WO | WO 01/61704 A1 | 8/2001 |
| WO | WO0161704 | 8/2001 |
| WO | WO 01/86640 A2 | 11/2001 |
| WO | WO 01/97223 A2 | 12/2001 |
| WO | WO 02/15111 A1 | 2/2002 |
| WO | WO 02/41236 A2 | 5/2002 |
| WO | WO 02/052569 A2 | 7/2002 |
| WO | WO 02/063451 A1 | 8/2002 |
| WO | WO 02/082273 | 10/2002 |
| WO | WO 02/082273 A1 | 10/2002 |

OTHER PUBLICATIONS

U.S. Appl. No. 29/181,635, filed May 14, 2003, Lian.
U.S. Appl. No. 29/204,475, filed Apr. 28, 2004, Lian.
Web page www..thumbdrive.com/specification; specificationnew1.htm.
Web page www.pendrive.com/intro.php.
Web page 63.224.30.26/memstrick/magicgate.html.
M-Systems Introduces Pocketable, Reliable and Simple-to-Use Personal Storage Device for PC and Mac Users—Revolutionary New Pen Sized Secured Storage Device Plugs Directly Into USB Ports and Delivers up to 32 MB of Removable Storage for Data, Music and Photo Files. Fremont, California, Nov. 6, 2000. http://www.m-sys.com/content/news/prInfo.asp?id=170.
PCT/SG03/00053, Mar. 17, 2003, PCT Search Report.

* cited by examiner

MEMORY MODULE WITH AUDIO PLAYBACK MODE

FIELD OF THE INVENTION

This invention relates to a memory module with an audio playback mode and refers particularly, though not exclusively, to such a memory module where the one connector port is able to be used for data input and output, both digital and analogue, the analogue including a playback mode.

BACKGROUND TO THE INVENTION

At present there are a range of memory modules in use. An example of such memory modules is MP3 players. These require a cable to enable them to be connected to a user's computer to enable the transfer of music from the computer to the player. Such cables may be an RS-232 cable, USB cable or an IEEE1394 cable. Presently, two different high-speed cables are achieving consumer acceptance—USB1.1 and 2.0, and IEEE1394. The IEEE1394 is known as "Firewire". With these, differential data lines are used to transmit data at speeds of up to 480 MHz. Any playback or output will be through a separate connection port. As such, the input lines and the output lines are mutually exclusive and the input lines serve no purpose during playback, and the playback lines serve no function during download.

According to one aspect of the invention, provided is a memory module where the differential data lines used to download data to the memory module are also used to provide analogue output.

SUMMARY OF THE INVENTION

According to one aspect of the invention, provided is a memory module with a playback mode for audio signals through a playback port, and having an input port for input of both analogue and data signals as well as power, the power being from a separate power source. The input port may be a USB or IEEE1394 port and may be used with a battery pack and cradle having a female socket for receiving therein the input port. The input port includes at least four terminals including: ground, power, and at least two differential data terminals; the differential data terminals carrying signals at frequencies in the range of from 1 to 480 MHz. The input port is also for passing power from the battery pack and cradle to the memory module.

The memory module may include a controller circuit and an earphone socket. Alternatively, the connector is used for audio output through an earphone socket fitted to the battery pack and cradle, the audio signals being passed to the earphone socket by the differential data lines of the input port.

There may be further included a multiplexing circuit so that the memory module knows in which of a plurality of modes it is to operate. The plurality of modes may include audio and data in which case audio is replay only and data is download and replay. The multiplexing circuit selects between the output of a USB transceiver and an audio preamplifier.

The multiplexing circuit may be electronically operated by using a voltage level between a ground line and a power line, the voltage level being different when the memory module is fitted to a computer to when it is fitted to the battery pack and cradle. Alternatively, it may be mechanically operated by a physical switch for a user to operate to switch between data and audio modes.

Alternatively, the multiplexing circuit is mechanically operated by a mechanical switch including a finger fitted to the battery pack and cradle and a switch on the memory module such that whenever the memory module is fitted to battery pack and cradle the finger contacts the switch to switch the memory module to audio mode and, in the absence of the finger, the memory module will automatically be in data mode.

DESCRIPTION OF THE DRAWINGS

In order that the invention may be clearly understood and readily put into practical effect there shall now be described by way of non-limitative example only preferred embodiments of the present invention, the description being with reference to the accompanying illustrative drawings in which.

DESCRIPTION OF THE PREFERRED EMBODIMENTS

Figure 2:
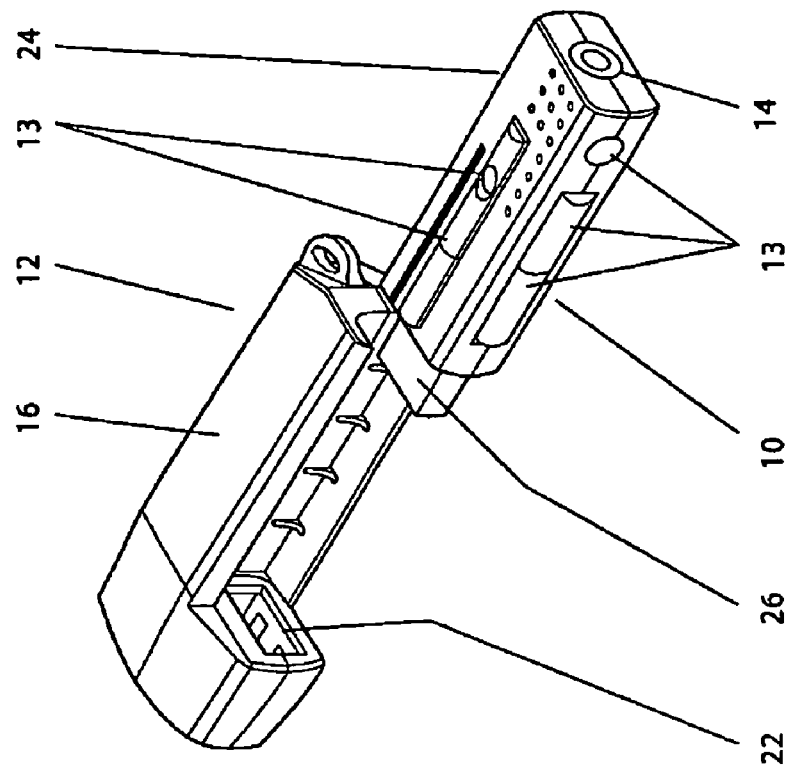
FIG. 2 is a view corresponding to FIG. 1 just prior to being fitted to the battery cradle.
Figure 1:
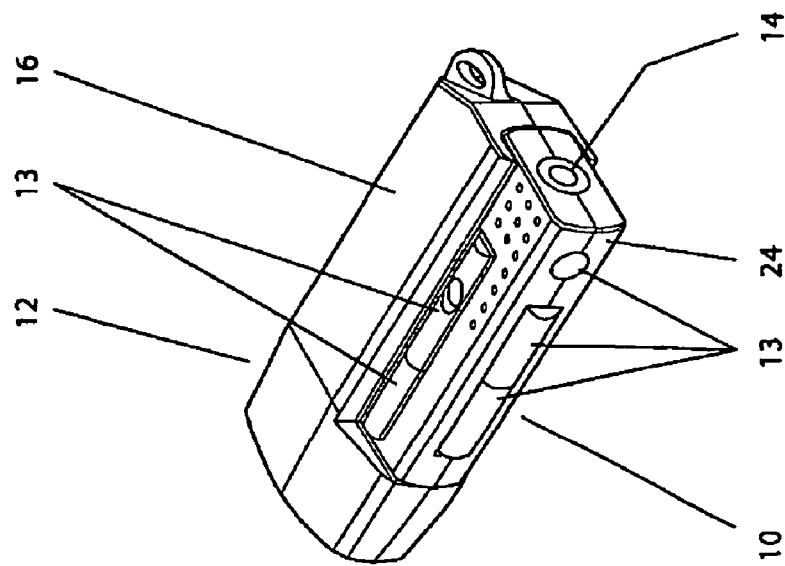
FIG. 1 is a front perspective view from above of a first embodiment fitted to a battery cradle.
Figure 4:
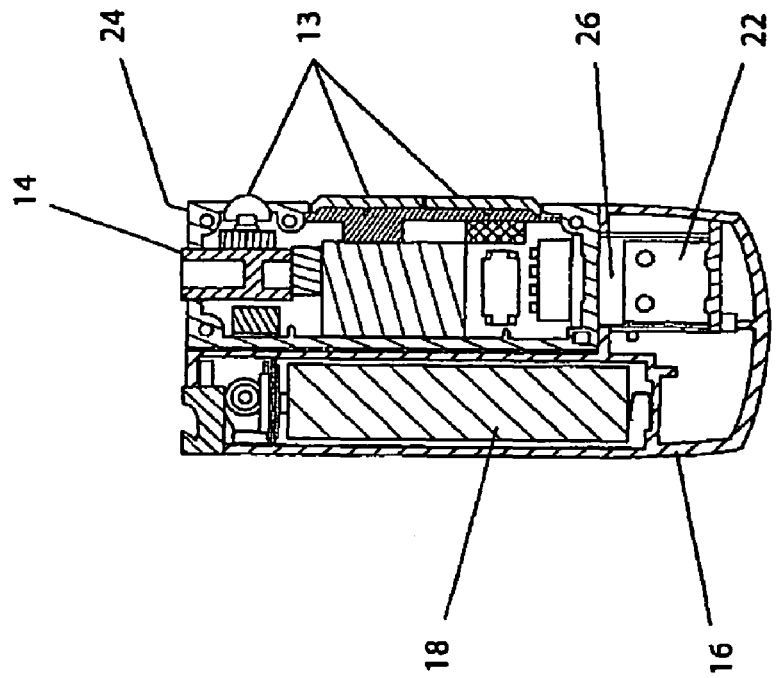
FIG. 4 is a cross-sectional view along the lines and in the direction of arrows B-B on FIG. 3.
Figure 3:
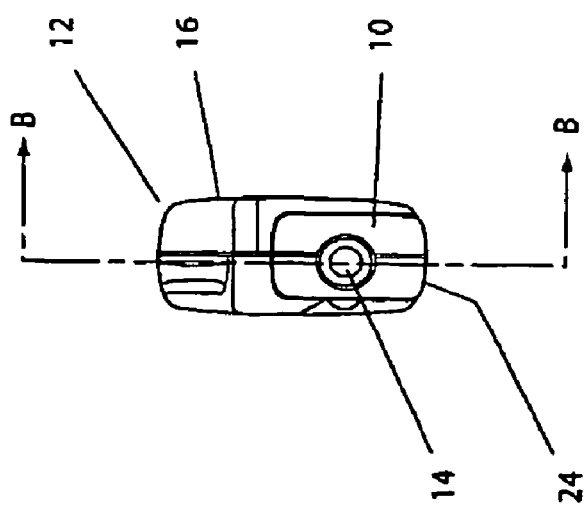
FIG. 3 is an end view of the first embodiment fitted to the battery cradle.
Figure 5:
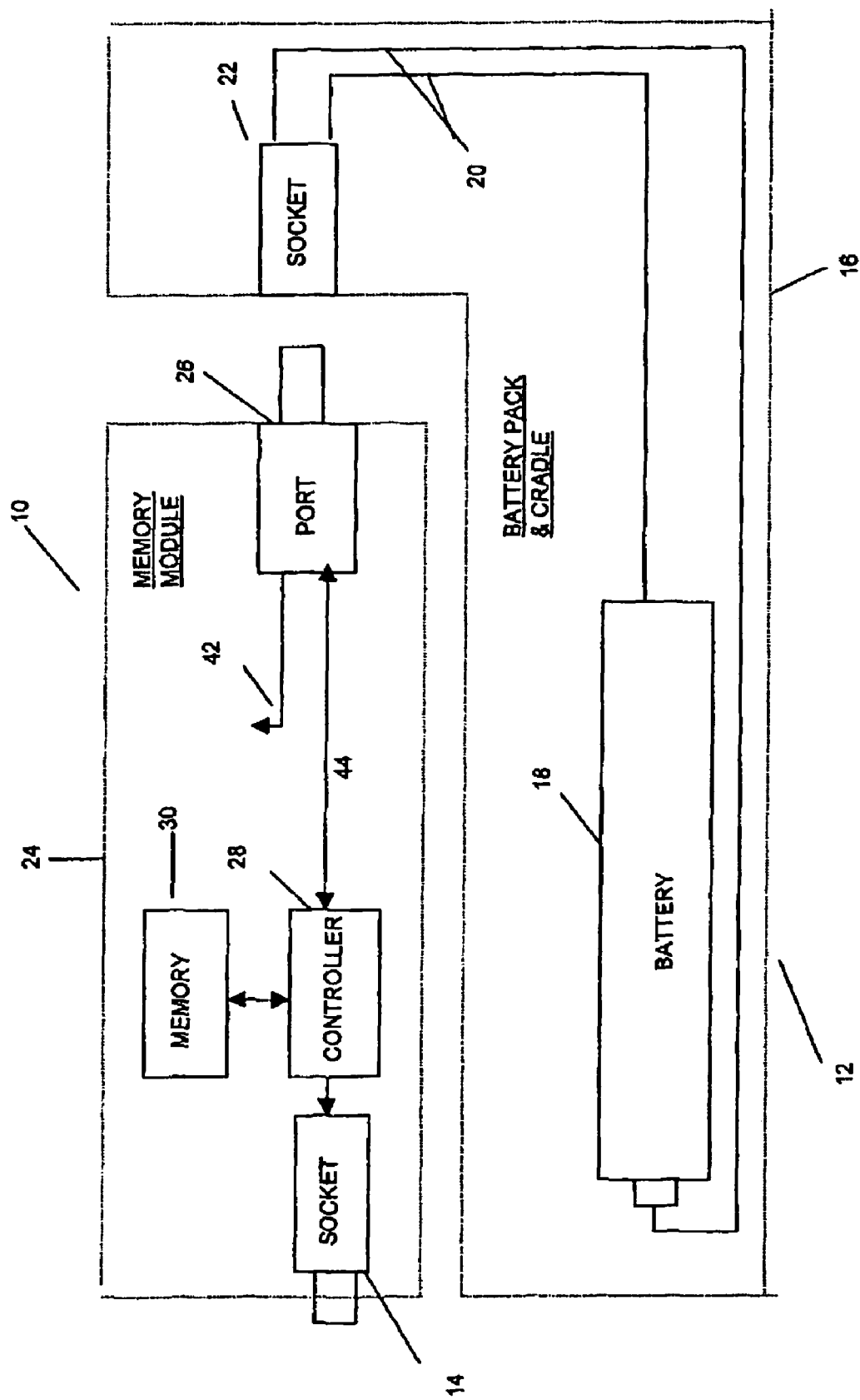
FIG. 5 is a schematic block diagram of the first embodiment just prior to engagement in the battery cradle.

To first refer to FIGS. 1 to 5, there is shown a memory module 10 adapted to be used with a computer (not shown) and is intended to be able to be used as a recording and playback module. For operation remote from the computer it is used with a mating battery pack and cradle 12.

The module 10 has functional controls 13 of a known type to control the playback of data stored in the module 10. That data may be audio and/or video and/or other storable data. For audio functions a headphone socket 14 is provided to enable a user to use the module 10 when fitted to the battery pack and cradle 12 without requiring other external reproduction devices.

The battery pack and cradle 12 has a cover 16 in which is releasably held a battery 18. The battery is connected to power lines 20 that are connected to a female socket 22.

The memory module 10 has a housing 24 in which the headphone socket 14 is fitted. Also fitted in housing 24 is a connector port 26 for data and power transfer. This may be a USB or IEEE1394 port. From the port 26 power 42 is passed to the required components of the memory module 10 in the known manner. Those components are of a known category and operation. Data 44 is passed to and from a controller circuit 28 and then to non-volatile memory 30. The controller circuit 28 is connected to the earphone socket 14.

When it is intended to download data to the module 10, it is removed from the battery pack and cradle 12 and connector 26 is connected directly to the user's computer's USB or IEEE1394 port ("port"). Power for the module is provided from the port 26 via the computer's port. When the user wants to use the module 10 in playback mode when connected to their computer, the port 26 is used to playback the data using the computer rather than the earphone socket 14.

Figure 6:
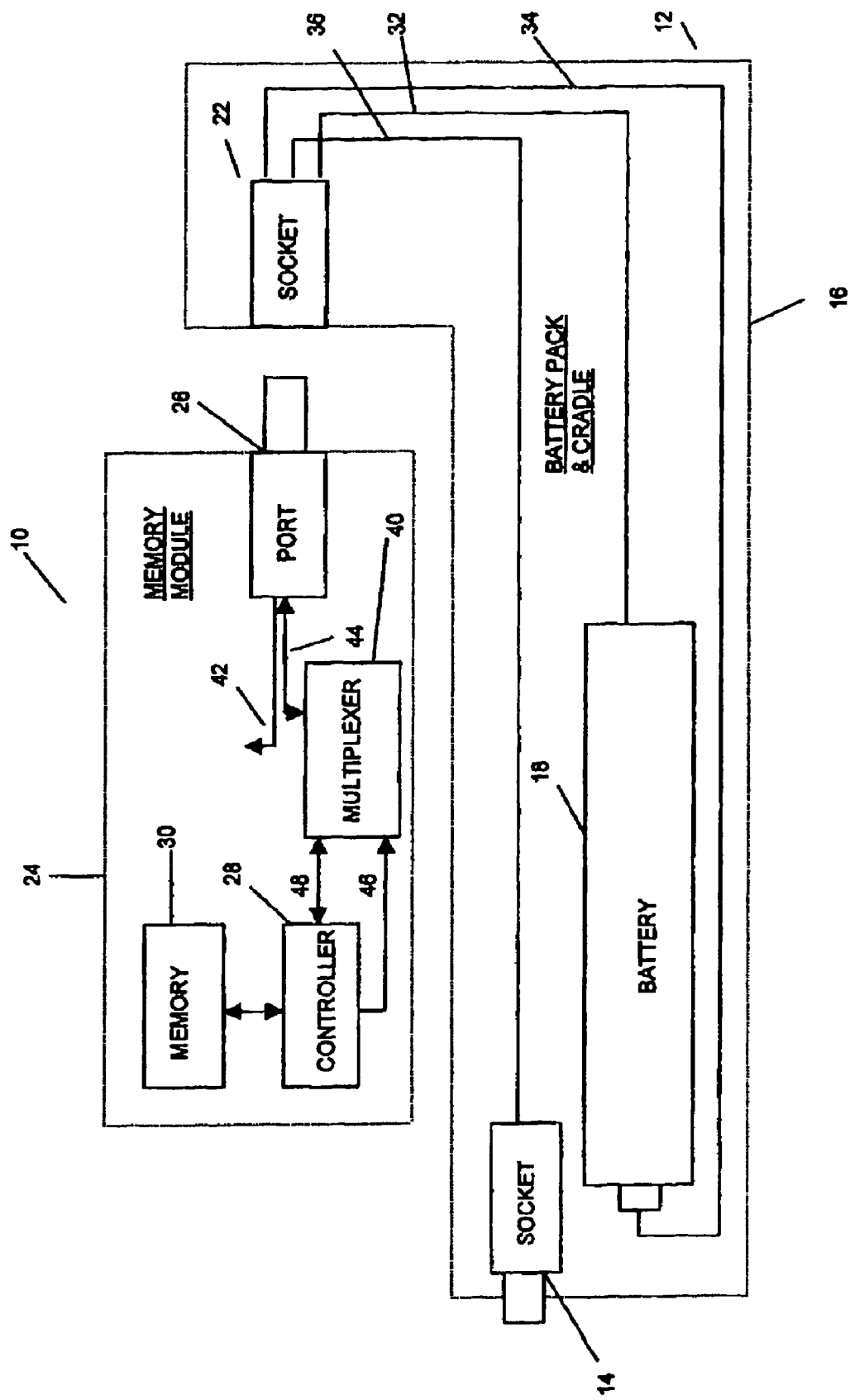
FIG. 6 is a view corresponding to FIG. 5 of a second embodiment.

The second embodiment of FIG. 6 shows where the port 26 is used for the audio output through the earphone socket 14, which in this case is fitted to cover 16. The port 26 and socket 22 each has at least four terminals each of which is connected to a separate line that are: ground 32, power 34 (+5 V), D+ 36 and D− 38 being the differential data lines. The data lines 36, 38 carry signals at frequencies in the range of from 1 to 480 MHz. Only the one line is shown representing the two data lines 36, 38 (audio left and right channels) for a USB port. An IEEE1394 port will have four data lines, and these are also represented by the single line 36,38.

Controller circuit 28 includes a multiplexing circuit 40 so that module 10 knows in which mode it is to operate—audio 46 or data 48. As can be seen, audio 46 is one way (playback) and data 48 is two way (download or input and playback or output). The circuit 40 selects between the output of the USB transceiver and audio preamplifier. It may be electronically or mechanically operated. For example, it may be electronic by using the voltage level between the ground 32 and the power line 34. As the voltage at the power line 34 is higher when connected to a computer than when connected to the battery pack, the controller circuit 28 can easily determine to which of a computer or battery pack the module is connected by measuring the voltage at power line 34.

The selection may be mechanical by having a physical switch for a user to operate to switch between data and audio (playback) modes. A mechanical switch may also be automatically operated by a finger fitted to cover 16 and that operates a physical switch on housing 24 whenever the module is fitted to battery pack and cradle 12 and switches the module to audio (playback) mode. In the absence of such a finger, the module will automatically be in data mode. Alternatively, the module 10 may be in audio (playback) mode in the absence of the finger.

As can be seen from the figures, the cradle 12 has a generally L-shaped configuration. The female data connector or socket 22 is formed in the short arm of the generally L-shaped configuration, while the compartment in the cradle 12 in which the battery 18 is located is formed in the long arm of the generally L-shaped configuration. As can be seen from FIGS. 1 and 4, the memory module and cradle are situated in a side-by-side configuration when the memory module and the cradle are assembled with the male 26 and female 22 data connectors engaged, with the compartment in which the battery 18 is located being alongside the memory module 10.

The present invention therefore provides a memory module able to be connected directly to the user's computer for download and playback, and for use remote from the computer by using a battery pack and cradle for playback using an earphone socket. This is different to present memory modules where they are either a storage device that has no playback capability and cannot be operated separately from their "master" machine (computer, PDA, or the like); or are a device such as an MP3 player where cables are required to connect the player to a computer for the downloading of the music to be stored on the player. The USB port of an MP3 players is used solely for data transfer during the downloading of the music. To give a reasonable playback time MP3 players have an in-built battery compartment in which batteries are located. That makes them rather large and prevents direct coupling with machines such as computers, PDAs, and so forth.

Whilst there has been described in the foregoing description a preferred embodiment of the present invention, it will be understood by those skilled in the technology that many variations or modifications in details of design, construction or operation may be made without departing from the present invention.

The present invention extends to all features disclosed either individually or in all possible permutations and combinations.

The invention claimed is:

1. A playback device, comprising:
    a connector port configured for both data transfer and analog audio playback signals through the connector port;
    a multiplexing circuit coupled to the connector port and that selects between a data mode and an audio playback mode, the multiplexing circuit being electronically operated by:
        measuring a voltage level between a ground line and a power line in the connector port; and
        determining the selection based on the measured voltage level;
    data storage to store audio data received via the connector port;
    functional controls to control the playback of audio data stored in the data storage; and
    an earphone socket, wherein the earphone socket is not used in place of the connector port to output analog audio when the playback device is in the audio playback mode and connected to an audio reproduction device via the connector port.

2. A playback device as claimed in claim 1, wherein the connector port is a USB or IEEE1394 connector port.

3. A playback device as claimed in claim 2, wherein the connector port is a male connector port.

4. A playback device as claimed in claim 2, wherein the analog audio output is provided on data lines in the connector port.

5. A playback device as claimed in claim 2, wherein, in the audio playback mode, the playback device is capable of receiving power via a power line in the connector port.

6. A playback device as claimed in claim 1, wherein the multiplexing circuit selects between the output of a data transceiver and an audio output circuit.

7. A playback device as claimed in claim 6 wherein the audio output circuit is an audio preamplifier.

8. A playback device as claimed in claim 4, wherein the multiplexing circuit is further coupled to the data lines and that selects between the output of a data transceiver and an audio output circuit.

9. A playback device as claimed in claim 1, wherein the analog audio output is provided on data lines in the connector port.

10. A playback device as claimed in claim 1, wherein, in the audio playback mode, the playback device is capable of receiving power via a power line in the connector port.

11. A playback device as claimed in claim 3, wherein the audio playback is provided on data lines in the connector port.

12. A playback device as claimed in claim 9, wherein, in the audio playback mode, the playback device is capable of receiving power via a power line in the connector port.

13. A playback device as claimed in claim 9, wherein the multiplexing circuit is further coupled to the data lines and that selects between the output of a data transceiver and an audio output circuit.

14. A playback device as claimed in claim 13 wherein the audio output circuit is an audio preamplifier.

15. A playback device as claimed in claim 11, wherein the multiplexing circuit is further coupled to the data lines and that selects between the output of a data transceiver and an audio output circuit.

16. A playback device as claimed in claim 15 wherein the audio output circuit is an audio preamplifier.

17. A playback device as claimed in claim 1, wherein the audio reproduction device is a computer.

18. An audio reproduction device, comprising:
an audio output interface; and
a receiving connector port operable to receive analog audio from a connector port of a playback device for output through the audio output interface, the playback device comprising:
  the connector port configured for both data transfer and analog audio playback signals through the connector port;
  a multiplexing circuit coupled to the connector port and that selects between a data mode and an audio playback mode, the multiplexing circuit being electronically operated by:
    measuring a voltage level between a ground line and a power line in the connector port; and
    determining the selection based on the measured voltage level;
  data storage to store audio data received via the connector port;
  functional controls to control the playback of audio data stored in the data storage; and
  an earphone socket, wherein the earphone socket is not used in place of the connector port to output analog audio when the playback device is in the audio playback mode and connected to the audio receiving device via the connector port.

19. An audio reproduction device as claimed in claim 18, wherein the receiving connector port is a USB or IEEE1394 connector port.

20. An audio reproduction device as claimed in claim 19, wherein the receiving connector port is a female connector port.

21. An audio reproduction device as claimed in claim 19, wherein the analog audio output is provided on data lines in the receiving connector port.

22. An audio reproduction device as claimed in claim 19, wherein, in the audio playback mode, the playback device is capable of receiving power via a power line in the receiving connector port.

23. An audio reproduction device as claimed in claim 18, wherein the multiplexing circuit selects between the output of a data transceiver and an audio output circuit.

24. An audio reproduction device as claimed in claim 23, wherein the audio output circuit is an audio preamplifier.

25. An audio reproduction device as claimed in claim 21, wherein the multiplexing circuit is further coupled to the data lines and that selects between the output of a data transceiver and an audio output circuit.

26. An audio reproduction device as claimed in claim 18, wherein the audio reproduction device is a computer.

* * * * *